(12) United States Patent
Hakuma et al.

(10) Patent No.: US 8,614,114 B2
(45) Date of Patent: Dec. 24, 2013

(54) PROCESS FOR PRODUCING LIGHT ABSORBING LAYER IN CIS BASED THIN-FILM SOLAR CELL

(75) Inventors: Hideki Hakuma, Tokyo (JP); Yuri Yamaguchi, Tokyo (JP); Katsuya Tabuchi, Tokyo (JP); Katsumi Kushiya, Tokyo (JP)

(73) Assignee: Showa Shell Sekiyu K.K., Tokyo (JP)

( * ) Notice: Subject to any disclaimer, the term of this patent is extended or adjusted under 35 U.S.C. 154(b) by 668 days.

(21) Appl. No.: 12/745,116

(22) PCT Filed: Nov. 28, 2008

(86) PCT No.: PCT/JP2008/071617
§ 371 (c)(1),
(2), (4) Date: May 27, 2010

(87) PCT Pub. No.: WO2009/069729
PCT Pub. Date: Jun. 4, 2009

(65) Prior Publication Data
US 2010/0311202 A1    Dec. 9, 2010

(30) Foreign Application Priority Data
Nov. 30, 2007    (JP) .................... 2007-310784

(51) Int. Cl.
*H01L 21/00*    (2006.01)
(52) U.S. Cl.
USPC .................... 438/95; 257/E31.029
(58) Field of Classification Search
USPC .................... 438/95; 257/E31.029
See application file for complete search history.

(56) References Cited

U.S. PATENT DOCUMENTS

| 8,153,469 B2* | 4/2012 | Aksu et al. .................... 438/84 |
| 2004/0063320 A1* | 4/2004 | Hollars .................... 438/689 |
| 2005/0006221 A1* | 1/2005 | Takeuchi et al. ............ 204/192.1 |
| 2005/0109392 A1* | 5/2005 | Hollars .................... 136/265 |

(Continued)

FOREIGN PATENT DOCUMENTS

| JP | 5-063224 A | 3/1993 |
| JP | 6-120545 A | 4/1994 |

(Continued)

OTHER PUBLICATIONS

K. Kushiya et al. "The Role of CU(InGa) (SeS) 2 Surface Layer on a Graded Band-Gap Cu(InGa) Se2 Thin-Film Solar Cell Prepared by Two-Stage Method", 25th IEEE Photovoltaic Specialists Conference, 1996, pp. 989-992.

(Continued)

*Primary Examiner* — Matthew Landau
*Assistant Examiner* — Igwe U Anya
(74) *Attorney, Agent, or Firm* — Westerman, Hattori, Daniels & Adrian, LLP

(57) ABSTRACT

A treatment object containing any one of Cu/Ga, Cu/In and Cu—Ga/In is held in a heated state at a temperature $T_1$ for a time $\Delta t_1$ in such a state that a selenium source is introduced, thereby forming a selenide. Thereafter, a sulfur source is introduced to replace the atmosphere in the system with a sulfur atmosphere. In this state, the treatment object is held in a heated state at a temperature $T_2$ for a time $\Delta t_2$. The temperature of the treatment object is then decreased to $T_3$, and, at that temperature, the treatment object is held in a heated state for a time $\Delta t_3$.

5 Claims, 3 Drawing Sheets

(56) References Cited

U.S. PATENT DOCUMENTS

| | | | |
|---|---|---|---|
| 2007/0004078 A1* | 1/2007 | Alberts | 438/95 |
| 2007/0257255 A1* | 11/2007 | Dhere et al. | 257/40 |
| 2008/0096307 A1* | 4/2008 | Basol | 438/104 |
| 2009/0020149 A1* | 1/2009 | Woods et al. | 136/244 |
| 2009/0065060 A1* | 3/2009 | Yonezawa et al. | 136/265 |

FOREIGN PATENT DOCUMENTS

| | | |
|---|---|---|
| JP | 6-188444 A | 7/1994 |
| JP | 9-82992 A | 3/1997 |
| JP | 10-135495 A | 5/1998 |
| JP | 10-135498 A | 5/1998 |
| JP | 11-322500 A | 11/1999 |
| JP | 2000-501232 A | 2/2000 |
| JP | 2006-196771 A | 7/2006 |
| JP | 2007-503708 A | 2/2007 |

OTHER PUBLICATIONS

International Search Report of PCT/JP2008/071617, mailing date of Mar. 3, 2009.

* cited by examiner (a)

(b)

(c)

(d)

(e)

(f)

(g)

(h)

(i)

(j)

(k)

(l)

(m)

PROCESS FOR PRODUCING LIGHT ABSORBING LAYER IN CIS BASED THIN-FILM SOLAR CELL

TECHNICAL FIELD

The present invention relates to a process for producing a light absorbing layer in a CIS based thin-film solar cell, and more specifically to a process for producing the light absorbing layer in the CIS based thin-film solar cell capable of achieving high open circuit voltage ($V_{OC}$) while maintaining a high fill factor (FF) by inhibiting leaks, and capable of realizing high conversion efficiency.

BACKGROUND ART

FIG. 5 illustrates a structure of a conventional general CIS based thin-film solar cell. A CIS based thin-film solar cell 20 has a structure obtained by sequentially stacking a metal back electrode layer 2, a p-type CIS based light absorbing layer 13, an n-type high resistance buffer layer 4 and an n-type transparent conductive film window layer 5 on a glass substrate 1. Herein, the p-type CIS based light absorbing layer 13 is composed of a p-type I-III-VI$_2$ group chalcopyrite semiconductor such as CuInSe$_2$(CIS), CuInS$_2$(CIS), CuIn(SSe)$_2$ (CISS), CuGaSe$_2$(CGS), CuGaS$_2$(CGS), CuGa(SSe)$_2$ (CGSS), Cu(InGa)Se$_2$(CIGS), Cu(InGa)S$_2$(CIGS), Cu(InGa)(SSe)$_2$(CIGSS) or a CIS based compound semiconductor thin-film such as CIGS having a thin-film layer of CIGSS or the like as a surface layer.

In order to produce the p-type CIS based light absorbing layer 13 by a selenization/sulfurization method, selenization and/or sulfurization of a metal precursor film (hereinafter, also referred to as a film-forming object) having a stacked structure formed of any one of Cu/Ga, Cu/In and Cu—Ga/In is performed on the metal back electrode layer 2 on the glass substrate 1.

Selenization is performed by installing the film-forming object in a device and replacing an inside of the device with inert gas such as nitrogen gas, and thereafter introducing a selenium source and increasing a temperature to hold the object for a certain time at a certain temperature.

Also, sulfurization is performed by installing the film-forming object in the device and replacing the inside of the device with an inert gas such as nitrogen gas, and thereafter, introducing a sulfur source such as sulfurized gas, and increasing the temperature to hold the object for a certain time at a certain temperature.

At the time of selenization and sulfurization, the inside of the device is first replaced with an inert gas such as nitrogen gas, thereafter the selenium source is introduced, and as illustrated in FIG. 6, the temperature is increased and the object is held for a certain time at a certain temperature for selenization 31, then, in a state in which selenium atmosphere in the device is replaced with sulfur atmosphere, the temperature in the device is further increased and sulfurization 32 is performed by holding the object for a certain time at a certain temperature, thereby forming the sulfide/selenide-based CIS based light absorbing layer 13 (refer to a temperature profile illustrated in FIG. 6).

The CIS based compound semiconductor thin-film solar cell has a tendency to increase contents of Ga and S, which are composition components of the light absorbing layer 13, to improve the conversion efficiency (refer to Patent Documents 1, 2 and 3, for example). Patent Document 1 discloses that the high conversion efficiency may be obtained by setting the Ga content in a range not smaller than 0.117 and not larger than 0.434 (Ga composition in a III-group element) by a multi source coevaporation method when forming the light absorbing layer in the CIS based compound semiconductor thin-film solar cell.

Patent Document 1: Japanese Patent Application Laid-Open No. 9-829992
Patent Document 2: Japanese Patent Application Laid-Open No. 10-135495
Patent Document 3: Japanese Patent Application Laid-Open No. 10-135498

DISCLOSURE OF THE INVENTION

Problems to be Solved by the Invention

However, in the multi source coevaporation method, there is a serious problem that uniformity in a large area is hardly secured and film-forming equipment is complicated and expensive.

On the other hand, although the selenization/sulfurization method having an excellent aptitude for industrially and uniformly forming the CIS based compound semiconductor thin-film of large area is based on thermal diffusion of constituent element, since a diffusion rate of Ga is substantially slower than that of other elements, long processing time at a high temperature is required to uniformly diffuse Ga. In a case of the high-temperature and long-time process, a light absorbing layer quality capable of achieving the high $V_{OC}$ may be obtained by Ga diffusion and increase in crystal grain diameter; however, when leak component in a p-n junction is large, the $V_{OC}$ also decreases by being affected thereby. Also, there is a problem notably occurring in the sulfurization process that the high FF may not be achieved due to deterioration of a p-n junction quality because surface etching by sulfur occurs. Therefore, it is difficult to achieve a good balance between the high $V_{OC}$ and the high FF in the conventional selenization/sulfurization profile.

The present invention has been achieved in view of the above-described circumstances, and an object of the present invention is to provide a process for producing the light absorbing layer in the CIS based thin-film solar cell capable of achieving the high $V_{OC}$ while maintaining the high FF by inhibiting the leak by using the selenization/sulfurization method and capable of realizing the high conversion efficiency.

Means for Solving the Problems

To achieve the above-described object, a process for producing a light absorbing layer in a CIS based thin-film solar cell of the present invention is selenization and/or sulfurization of a treatment object by a two-stage thermal treatment process to apply first thermal treatment to hold the treatment object for a certain time at a predetermined temperature in atmosphere having a selenium source and/or a sulfur source, and thereafter apply second thermal treatment to hold the treatment object for a time longer than the holding time of the first thermal treatment at a temperature lower than the holding temperature of the first thermal treatment.

Before the two-stage thermal treatment process, a preliminary thermal treatment process may be performed to hold the treatment object for a certain time at a temperature lower than the holding temperature of the first thermal treatment in the atmosphere having the selenium source and/or the sulfur source.

The holding temperature of the first thermal treatment in the two-stage thermal treatment process is preferably 500 to 650° C. and the holding time is preferably 5 to 120 minutes.

The holding temperature of the second thermal treatment in the two-stage thermal treatment process is preferably 480 to 600° C. and the holding time is preferably 20 to 300 minutes.

The holding temperature in the preliminary thermal treatment process is preferably 350 to 550° C. and the holding time is preferably 10 to 240 minutes.

The treatment object may be obtained by stacking a metal precursor film on a metal back electrode layer formed on a substrate, and the metal precursor film may contain any one of Cu/Ga, Cu/In, Cu—Ga alloy/In and Cu—In—Ga alloy.

Selenium and/or sulfur may be contained in the metal precursor film.

The selenium source is preferably hydrogen selenide, and the sulfur source is preferably hydrogen sulfide.

Also, a process for producing a light absorbing layer in a CIS based thin-film solar cell of the present invention includes: a selenization process to make a treatment object containing any one of Cu/Ga, Cu/In, Cu—Ga alloy/In and Cu—In—Ga alloy as a metal precursor film into selenide in a preliminary thermal treatment process to hold the treatment object in atmosphere having a selenium source at a predetermined temperature; and a sulfurization process to perform sulfurization of the selenide by increasing a temperature of the selenide after replacing the atmosphere having the selenium source with atmosphere having a sulfur source, and in a two-stage thermal treatment process, holding the selenide for a certain time at a first thermal treatment temperature higher than the holding temperature of the preliminary thermal treatment process, and thereafter holding the selenide for a time longer than the holding time of the first thermal treatment at a second thermal treatment temperature lower than the first thermal treatment temperature.

The holding temperature of the first thermal treatment in the two-stage thermal treatment process is preferably 500 to 650° C. and the holding time is preferably 5 to 120 minutes.

The holding temperature of the second thermal treatment in the two-stage thermal treatment process is preferably 480 to 600° C. and the holding time is preferably 20 to 300 minutes.

The holding temperature in the preliminary thermal treatment process is preferably 350 to 550° C. and the holding time is preferably 10 to 240 minutes.

Selenium and/or sulfur may be contained in the metal precursor film.

Also, a process for producing a light absorbing layer in a CIS based thin-film solar cell of the present invention includes performing selenium treatment and/or sulfur treatment by applying first thermal treatment for forming a film of a treatment object on a metal back electrode layer formed on a substrate by a multi source coevaporation method using Cu, In, Ga and Se as materials while holding the treatment object for a certain time at a predetermined temperature, and thereafter applying second thermal treatment at a temperature lower than the holding temperature of the first thermal treatment in atmosphere having only a selenium source and/or a sulfur source.

The holding temperature of the first thermal treatment is preferably 500 to 650° C. and the holding time is preferably 5 to 120 minutes.

The holding temperature of the second thermal treatment is preferably 480 to 600° C. and the holding time is preferably 20 to 300 minutes.

Advantages of the Invention

According to the process for producing the light absorbing layer in the CIS based thin-film solar cell according to the present invention, the high $V_{OC}$ can be achieved by promoting the Ga diffusion and the large grain diameter while inhibiting the leak by inhibiting rough surface of the light absorbing layer by controlling the thermal treatment process in the atmosphere of the selenium source and the sulfur source, and the high conversion efficiency can be realized.

EXPLANATION OF THE REFERENCE NUMERALS

| 1 | glass substrate |
|---|---|
| 2 | metal back electrode layer |
| 3 | p-type CIS based light absorbing layer |
| 3A | treatment object |
| 3a | metal precursor film |
| 4 | n-type high resistance buffer layer |
| 5 | n-type transparent conductive film window layer (transparent conductive film layer) |
| 6 | furnace body |
| 7 | heater |
| 10 | CIS based thin-film solar cell |
| 13 | p-type CIS based light absorbing layer |
| 20 | CIS based thin-film solar cell |
| 31 | selenization |
| 32 | sulfurization |
| 33 | simultaneous coevaporation |
| 34 | selenium treatment |
| 35 | sulfur treatment |
| 36 | selenium and sulfur treatment |

BEST MODE FOR CARRYING OUT THE INVENTION

Hereinafter, one embodiment of the present invention will be described in detail with reference to the drawings.
(Basic Structure of Cis Based Thin-Film Solar Cell)

Figure 1:
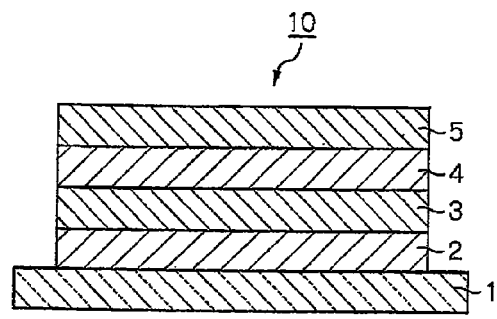
FIG. 1 is a cross-sectional view illustrating a basic structure of a CIS based thin-film solar cell produced by using a process for producing a light absorbing layer according to one embodiment of the present invention.

FIG. 1 illustrates a basic structure of a CIS based thin-film solar cell produced by using a process for producing a light absorbing layer of the present invention.

A CIS based thin-film solar cell 10 has a substrate structure obtained by sequentially stacking a metal back electrode layer 2, a p-type CIS based light absorbing layer 3, an n-type high resistance buffer layer 4 and an n-type transparent conductive film window layer 5 on a glass substrate 1, and is a p-n heterojunction device.

The glass substrate 1 is a substrate on which the above-described layers are to be stacked, and a glass substrate such as soda-lime glass, a metal substrate such as a stainless plate and a resin substrate such as a polyimide film are used.

The metal back electrode layer 2 is highly corrosion-resistant metal having a high melting point such as Mo or Ti having thickness of 0.2 to 2 µm and produced on the glass substrate 1, and film-formation is performed by a DC sputtering method or the like using the metal as a target.

The light absorbing layer 3 is a CIS based compound semiconductor thin-film having thickness of 1 to 3 µm and p-type conductivity, that is, a I-III-VI$_2$ group chalcopyrite semiconductor, specific examples of which include CuInSe$_2$ (CIS), CuInS$_2$(CIS), CuIn(SSe)$_2$(CISS), CuGaSe$_2$(CGS), CuGaS$_2$(CGS), CuGa(SSe)$_2$(CGSS), Cu(InGa)Se$_2$(CIGS), Cu(InGa)S$_2$(CIGS), and Cu(InGa)(SSe)$_2$(CIGSS). Also, the light absorbing layer 3 may be composed of the CIS based compound semiconductor thin-film such as CIS, CISS, CGS, CGSS, CIGS and CIGSS having a thin-film layer of CIGSS or the like as a surface layer.

The n-type high resistance buffer layer 4 is transparent and highly resistant, and is formed of a II-VI compound semiconductor thin-film such as CdS, ZnS and ZnO, Zn(O, S, OH)$_x$ which is mixed crystal thereof, and an In-based compound semiconductor thin-film such as In$_2$O$_3$, In$_2$S$_3$ and In(OH)$_x$, and the film-formation is performed by a chemical bath deposition method, an MOCVD method or the like.

The n-type transparent conductive film window layer 5 is a transparent and low resistance semiconductor thin-film made of zinc oxide and ITO and having thickness of 0.05 to 2.5 µm, n-type conductivity and a wide band gap, and the film-formation is performed by the sputtering method, the MOCVD method or the like.

(Process for Producing Light Absorbing Layer in Cis Based Thin-Film Solar Cell)

The p-type CIS based light absorbing layer 3 may be produced, for example, by forming a metal precursor film having a stacked structure containing Cu, In and Ga or of mixed crystal thereof on the metal back electrode layer 2 on the glass substrate 1 by the sputtering method, an evaporation method or the like, (hereinafter, the glass substrate obtained by forming the metal precursor film on the metal back electrode layer 2 is also referred to as a "treatment object") and thereafter performing selenization and/or sulfurization of the treatment object.

Figure 2:
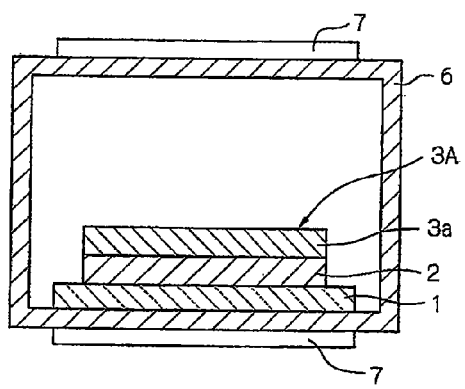
FIG. 2 is a schematic diagram for illustrating the process for producing the light absorbing layer according to one embodiment of the present invention.
Figure 3:
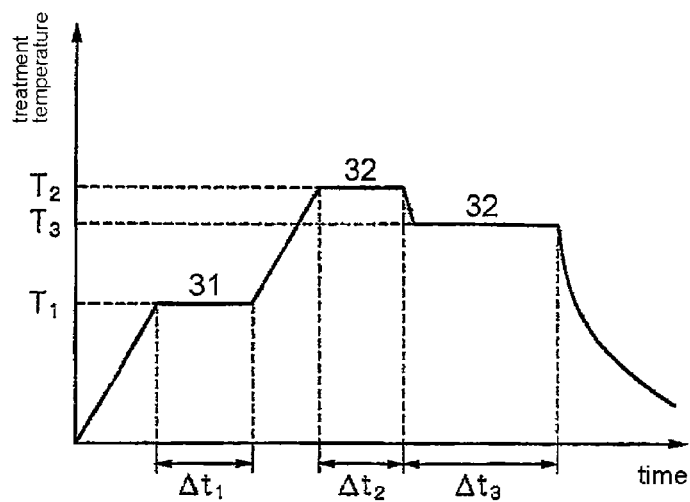
FIG. 3 is a graph illustrating an example of a temperature profile in the process for producing the light absorbing layer according to one embodiment of the present invention.

A process of selenization and/or sulfurization of the treatment object may be performed, for example, by arranging a treatment object 3A (glass substrate 1 obtained by forming the metal precursor film 3a on the metal back electrode layer 2) in a furnace body 6 such as a quartz chamber as illustrated in FIG. 2, then heating the object by a heater 7 according to a profile of temperature and processing time illustrated in FIG. 3 as an example, and allowing the object to contact a selenium source and a sulfur source.

The furnace body 6 has a control mechanism capable of controlling a temperature in the furnace body 6 by the heater 7, and may increase the temperature in the furnace body 6 at a predetermined temperature increasing rate and maintain the predetermined temperature. Also, a natural convection system, a forced convection system or the like may be used in the selenization and sulfurization in the furnace body 6, for example, without particular limitation. Hereinafter, an example of the temperature profile illustrated in FIG. 3 (case in which a sulfurization process is performed in two stages after performing a selenization process) will be described.

In the selenization process, first, in a state in which the selenium source diluted with inert gas such as nitrogen gas is introduced into the furnace body 6 to be sealed therein, the temperature is increased up to T$_1$ as illustrated in FIG. 3 (temperature increasing process 1). Then, by holding the treatment object for a predetermined time Δt$_1$ while keeping the temperature in the furnace body 6 at the temperature T$_1$, the treatment object 3A to which selenization 31 is performed, (hereinafter, also referred to as a "selenide") is produced. Meanwhile, the time Δt$_1$ includes not only time after the temperature becomes exactly T$_1$ but also time after the temperature increasing rate becomes 2° C. per minute or lower. Also, the temperature T$_1$ is the maximum temperature after the temperature increasing rate becomes 2° C. per minute or lower.

Meanwhile, as the selenium source, hydrogen selenide gas diluted to have molar ratio concentration at a normal temperature in the range of 1 to 20% and desirably 2 to 10% may be used.

Also, T$_1$ is 350 to 550° C. and desirably 380 to 500° C., and the time Δt$_1$ to keep the temperature in the furnace body 6 at the temperature T$_1$ is 10 to 240 minutes and desirably 20 to 120 minutes.

Also, in the temperature increasing process 1, the temperature desirably increases at a rate of 2 to 100° C. per minute.

Examples of the selenide include CuInSe$_2$, Cu(InGa)Se$_2$, and CuGaSe$_2$.

In the sulfurization process, first, in a state after the selenization, selenium atmosphere sealed in the furnace body 6 is evacuated once by means of a vacuum pump or the like; thereafter, the inert gas such as nitrogen gas and a sulfur source are introduced into the furnace body 6 to replace the atmosphere therein with sulfur atmosphere, and the temperature in the furnace body 6 is further increased up to T$_2$ as illustrated in FIG. 3 (temperature increasing process 2). Then, by holding the treatment object for a predetermined time Δt$_2$ while keeping the temperature in the furnace body 6 at the temperature T$_2$, sulfurization 32 of the selenide is performed (first sulfurization process). Meanwhile, the time Δt$_2$ includes not only time after the temperature becomes exactly T$_2$ but also time after the temperature increasing rate becomes 2° C. per minute or lower. Also, the temperature T$_2$ is the maximum temperature after the temperature increasing rate becomes 2° C. per minute or lower.

Meanwhile, as the sulfur source, the hydrogen sulfide gas diluted so as to have the molar ratio concentration at the normal temperature in the range of 1 to 30% and desirably 2 to 20% may be used.

Also, T$_2$ is 500 to 650° C. and desirably 520 to 600° C., and the time Δt$_2$ to keep the temperature in the furnace body 6 at the temperature T$_2$ is 5 to 120 minutes and desirably 10 to 60 minutes. However, T$_2$ is required to be higher than T$_1$. Also, in the temperature increasing process 2, the temperature desirably increases at a rate of 2 to 100° C. per minute.

Next, as a second sulfurization process, the temperature in the furnace body 6 is decreased to T$_3$ as illustrated in FIG. 3 (temperature decreasing process 1). Then, by holding the treatment object for a predetermined time Δt$_3$ while keeping the temperature in the furnace body 6 at the temperature T$_3$ to perform the sulfurization 32 and thereafter cooling the same, film-formation of the p-type CIS based light absorbing layer is finished. At that time, although the atmosphere in the furnace may be that of the first sulfurization process, the concentration of hydrogen sulfide gas may be changed or hydrogen selenide may be introduced. Also, Δt$_3$ includes time for the temperature decreasing process 1, and the temperature $T_3$ is the maximum temperature after a temperature decreasing rate becomes 1° C. per minute or lower.

$T_3$ is 480 to 600° C. and desirably 500 to 560° C., and the time $\Delta t_3$ to keep the temperature in the furnace body 6 at the temperature $T_3$ is 20 to 300 minutes and desirably 30 to 240 minutes. However, $T_3$ is required to be lower than $T_2$.

Also, in the temperature decreasing process 1, the temperature desirably decreases at a rate of 1 to 100° C. per minute.

The p-type CIS based light absorbing layer 3 formed through the above-described selenization process and sulfurization process is the film formed of $CuIn(SSe)_2$, $Cu(InGa)(SSe)_2$, $CuGa(SSe)_2$ and the like.

Figure 4:
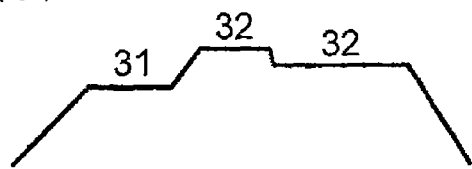
FIG. 4 is a graph illustrating another temperature profile in the process for producing the light absorbing layer according to one embodiment of the present invention.
Figure 4:
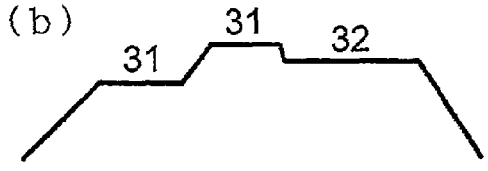
Figure 4:
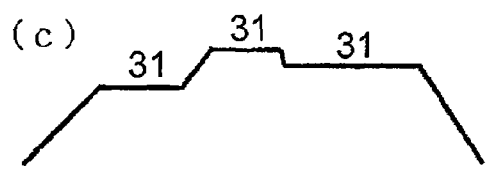
Figure 4:
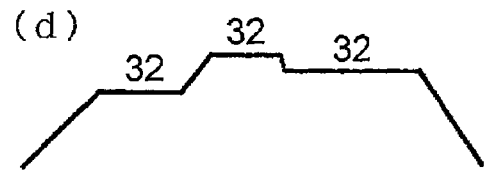
Figure 4:
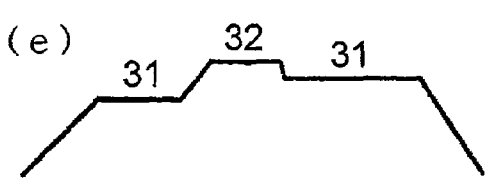
Figure 4:
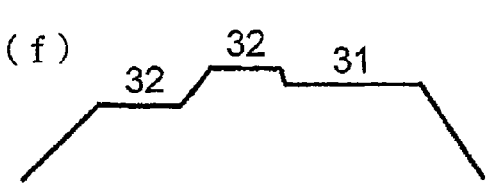
Figure 4:
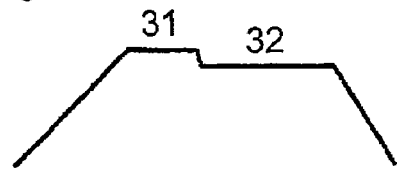
Figure 4:
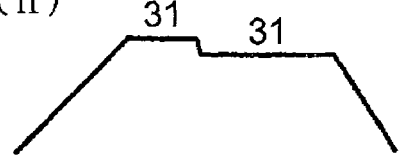
Figure 4:
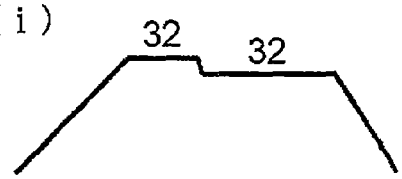
Figure 4:
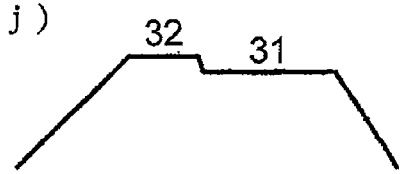
Figure 4:
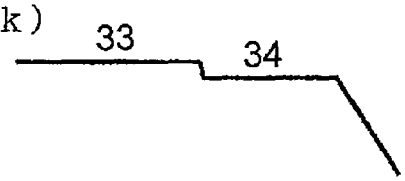
Figure 4:
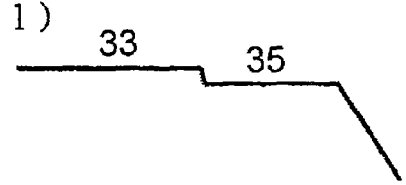
Figure 4:
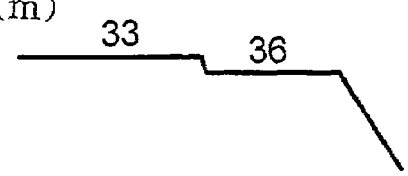

Although description has been made according to the temperature profile illustrated in FIG. 3 as above, the temperature profile is illustrative only, and as the temperature profile which may be used in the process for producing the light absorbing layer in the CIS based thin-film solar cell according to the present invention, as illustrated in FIG. 4, there are (a) selenization/sulfurization method (first flat portion/second flat portion/third flat portion selenization 31/sulfurization 32/sulfurization 32 from left to right of the temperature profile in the drawing: the same as FIG. 3), (b) selenization/sulfurization method (selenization 31/selenization 31/sulfurization 32, (c) selenization method (selenization 31/selenization 31/selenization 31), (d) sulfurization method (sulfurization 32/sulfurization 32/sulfurization 32), (e) selenization/sulfurization method (selenization 31/sulfurization 32/selenization 31), (f) sulfurization/selenization method (sulfurization 32/sulfurization 32/selenization 31) and the like in a case of a three-stage process, and there are (g) selenization/sulfurization method (selenization 31/sulfurization 32), (h) selenization method (selenization 31/selenization 31), (i) sulfurization method (sulfurization 32/sulfurization 32), (j) sulfurization/selenization method (sulfurization 32/selenization 31) and the like in a case of a two-stage process. Also, in a case of simultaneous coevaporation, there are (k) simultaneous coevaporation 33/selenium treatment 34, (l) simultaneous coevaporation 33/sulfur treatment 35, (m) simultaneous coevaporation 33/selenium and sulfur treatment 36 and the like.

EXAMPLES

Hereinafter, although the present invention will be specifically described based on examples, the examples to be described are illustrative only and the scope of the invention is not limited thereto.

According to the temperature profile illustrated in FIG. 3, the CIS based thin-film solar cell having the structure illustrated in FIG. 1 was produced by changing the selenization temperature $T_1$, the temperature $T_2$ of the first sulfurization process, the holding time $\Delta t_2$, the temperature $T_3$ of the second sulfurization process and the holding time $\Delta t_3$. Herein, in the selenization, the temperature increasing rate was set to 10° C. per minute, the holding time $\Delta t_1$ was set to 30 minutes and the gas to be introduced was 4% hydrogen selenide ($H_2Se$) with the remainder being nitrogen, and in the sulfurization, the temperature increasing rate was set to 5° C. per minute and the gas to be introduced was 10% hydrogen sulfide ($H_2S$) with the remainder being nitrogen and the temperature decreasing rate at the time of the second sulfurization process was set to 20° C. per minute. A measurement result of current-voltage characteristics of the obtained CIS based thin-film solar cell is illustrated in Table 1 (Examples 1 to 10). Meanwhile, measurement was conducted under the conditions of the cell temperature: 25° C., spectral distribution: reference solar radiation (AM 1.5) and irradiance: 1000 W/m².

Figure 5:
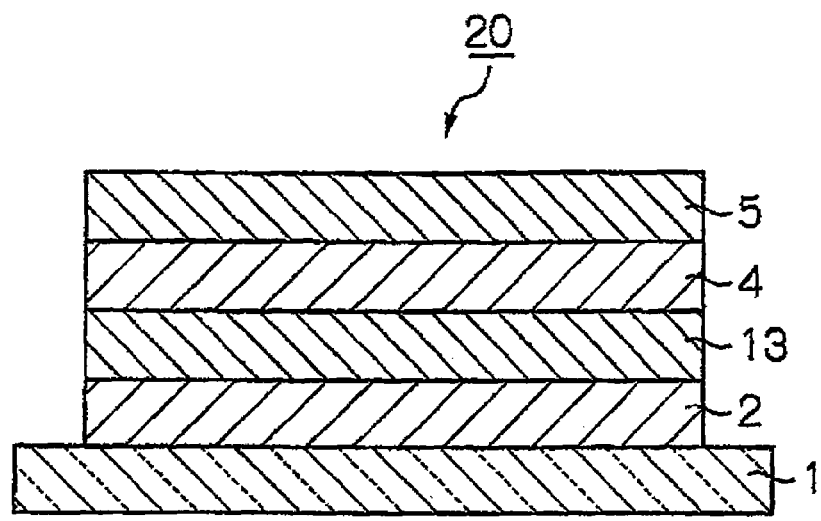
FIG. 5 is a cross-sectional view illustrating the basic structure of the CIS based thin-film solar cell produced by using a conventional process for producing the light absorbing layer.
Figure 6:
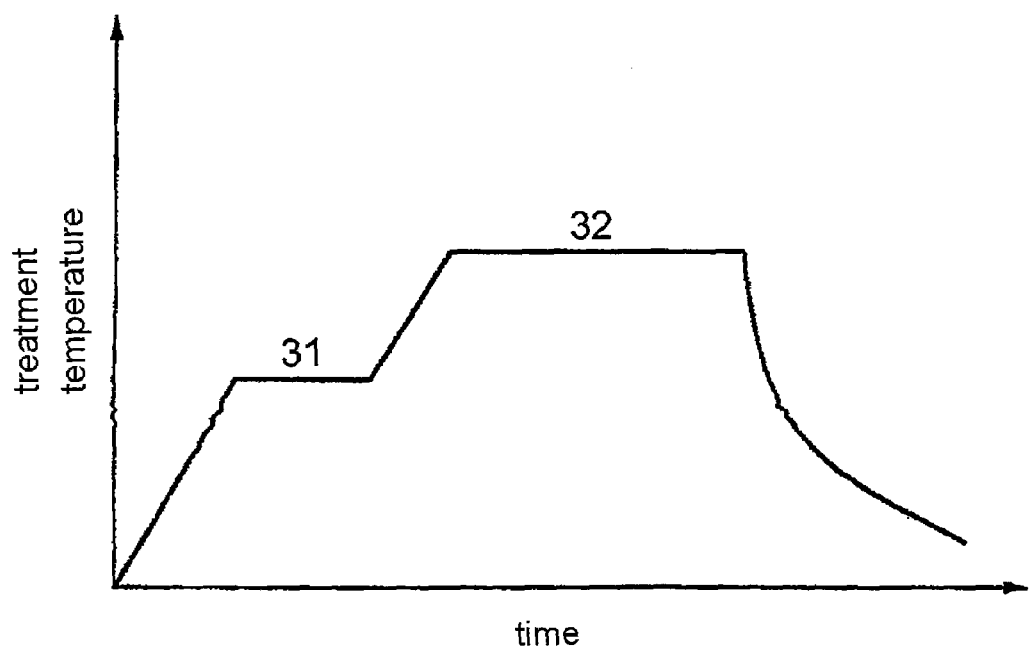
FIG. 6 is a graph illustrating the temperature profile in the conventional process for producing the light absorbing layer.

Also, as Comparative Examples, results obtained without performing the second sulfurization process according to the conventional temperature profile as illustrated in FIG. 5 are also illustrated in Table 1.

TABLE 1

| | selenization | first sulfurization | | second sulfurization | | sulfurization | $\Delta T$ | | | |
|---|---|---|---|---|---|---|---|---|---|---|
| | T1 °C. | T2 °C. | $\Delta t_2$ min | T3 °C. | $\Delta t_3$ min | time min | (T2 − T3) °C. | Voc [mV] | FF | Eff [%] |
| Example 1 | 400 | 560 | 30 | 540 | 50 | 80 | 20 | 595 | 0.619 | 12.18 |
| Example 2 | 400 | 560 | 30 | 540 | 80 | 110 | 20 | 609 | 0.622 | 12.85 |
| Example 3 | 410 | 560 | 20 | 540 | 80 | 100 | 20 | 606 | 0.626 | 12.85 |
| Example 4 | 410 | 560 | 30 | 540 | 80 | 110 | 20 | 628 | 0.663 | 13.74 |
| Example 5 | 410 | 560 | 30 | 520 | 80 | 110 | 40 | 585 | 0.655 | 13.25 |
| Example 6 | 420 | 560 | 30 | 540 | 80 | 110 | 20 | 613 | 0.645 | 12.84 |
| Example 7 | 420 | 570 | 30 | 540 | 80 | 110 | 30 | 634 | 0.659 | 12.97 |
| Example 8 | 430 | 560 | 30 | 540 | 80 | 110 | 20 | 608 | 0.663 | 13.28 |
| Example 9 | 430 | 570 | 30 | 540 | 50 | 80 | 30 | 607 | 0.647 | 12.42 |
| Example 10 | 430 | 570 | 30 | 540 | 80 | 110 | 30 | 634 | 0.670 | 12.95 |
| Comparative Example 1 | 455 | 540 | 80 | | | 80 | | 585 | 0.623 | 11.63 |
| Comparative Example 2 | 430 | 560 | 30 | | | 30 | | 501 | 0.610 | 10.15 |
| Comparative Example 3 | 400 | 560 | 30 | | | 30 | | 519 | 0.599 | 10.03 |
| Comparative Example 4 | 450 | 560 | 50 | | | 50 | | 545 | 0.579 | 10.36 |
| Comparative Example 5 | 430 | 560 | 50 | | | 50 | | 562 | 0.629 | 12.26 |
| Comparative Example 6 | 430 | 560 | 80 | | | 80 | | 585 | 0.620 | 11.96 |
| Comparative Example 7 | 430 | 580 | 30 | | | 30 | | 560 | 0.644 | 11.91 |
| Comparative Example 8 | 400 | 580 | 30 | | | 30 | | 555 | 0.620 | 10.84 |

TABLE 1-continued

| | selenization | first sulfurization | | second sulfurization | | sulfurization | ΔT | | | |
|---|---|---|---|---|---|---|---|---|---|---|
| | T1 °C. | T2 °C. | Δt2 min | T3 °C. | Δt3 min | time min | (T2 − T3) °C. | Voc [mV] | FF | Eff [%] |
| Comparative Example 9 | 430 | 580 | 50 | | | 50 | | 592 | 0.531 | 9.55 |

As is clear from Table 1, it has been found that high $V_{OC}$ is obtained and FF is maintained (not less than 0.6) by adopting the temperature profile in which the first sulfurization process is performed in a short time at a high temperature (not lower than 560° C.×20 or 30 minutes) and performing the second sulfurization process for a long time at a low temperature (520° C. or 540° C.×50 or 80 minutes) as in Examples 1 to 10.

On the other hand, in Comparative Examples 1 to 9, it has been found that the $V_{OC}$ is low, and the FF decreases due to an increase in leakage if treated for a long time at a high temperature (580° C.×50 minutes) as in the conventional example (Comparative Example 9), and although the FF is maintained, high open circuit voltage may not be obtained in the long time treatment at the low temperature (540° C.×80 minutes) (Comparative Example 1).

INDUSTRIAL APPLICABILITY

As described above in detail, according to the present invention, the light absorbing layer capable of achieving the high open circuit voltage ($V_{OC}$) while maintaining the high fill factor (FF) by inhibiting the leak, and capable of realizing high conversion efficiency may be produced, so that the layer may be preferably used as the light absorbing layer in the CIS based thin-film solar cell.

The invention claimed is:

1. A process for producing a light absorbing layer in a CIS based thin-film solar cell, comprising:
    a selenization process to make a treatment object containing any one of Cu/Ga, Cu/In, Cu—Ga alloy/In and Cu—In—Ga alloy as a metal precursor film into selenide in a preliminary thermal treatment process to hold the treatment object in atmosphere having a selenium source at a predetermined temperature; and
    a two-stage sulfurization process to perform sulfurization of the selenide by increasing a temperature of the selenide after replacing the atmosphere having the selenium source with atmosphere having a sulfur source, the two-stage sulfurization process comprising a first sulfurization process for performing sulfurization by holding the treatment object for a certain time at a first thermal treatment temperature higher than the holding temperature of the preliminary thermal treatment process, and a second sulfurization process for performing sulfurization by holding the treatment object for a time longer than the holding time of the first thermal treatment at a second thermal treatment temperature lower than the first thermal treatment temperature.

2. The process for producing a light absorbing layer in a CIS based thin-film solar cell according to claim 1, wherein the holding temperature of the first sulfurization process in the two-stage sulfurization process is 500 to 650° C. and the holding time is 5 to 120 minutes.

3. The process for producing a light absorbing layer in a CIS based thin-film solar cell according to claim 1, wherein the holding temperature of the second sulfurization process in the two-stage sulfurization process is 480 to 600° C. and the holding time is 20 to 300 minutes.

4. The process for producing a light absorbing layer in a CIS based thin-film solar cell according to claim 1, wherein the holding temperature in the preliminary thermal treatment process is 350 to 550° C. and the holding time is 10 to 240 minutes.

5. The process for producing a light absorbing layer in a CIS based thin-film solar cell according to claim 1, wherein selenium and/or sulfur is contained in the metal precursor film.

* * * * *